United States Patent
Wang et al.

(10) Patent No.: US 10,466,820 B2
(45) Date of Patent: Nov. 5, 2019

(54) OLED ARRAY SUBSTRATE, MANUFACTURING METHOD THEREOF AND TOUCH DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Heife, Anhui (CN)

(72) Inventors: Wenlong Wang, Beijing (CN); Yinhu Huang, Beijing (CN); Zhiyuan Lin, Beijing (CN); Ling Han, Beijing (CN); Jun Ma, Beijing (CN); Liang Lin, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 164 days.

(21) Appl. No.: 15/524,244

(22) PCT Filed: Dec. 11, 2015

(86) PCT No.: PCT/CN2015/097110
§ 371 (c)(1),
(2) Date: May 3, 2017

(87) PCT Pub. No.: WO2017/031867
PCT Pub. Date: Mar. 2, 2017

(65) Prior Publication Data
US 2017/0329443 A1 Nov. 16, 2017

(30) Foreign Application Priority Data

Aug. 27, 2015 (CN) .......................... 2015 1 0537061

(51) Int. Cl.
*G06F 3/041* (2006.01)
*H01L 21/77* (2017.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ..... G06F 3/0412; G06F 3/0416; G02F 1/1368
(Continued)

(56) References Cited

U.S. PATENT DOCUMENTS

2010/0276704 A1 11/2010 Park et al.
2014/0253502 A1 9/2014 Cho et al.
(Continued)

FOREIGN PATENT DOCUMENTS

CN 104036698 A 9/2014
CN 104699321 A 6/2015
(Continued)

OTHER PUBLICATIONS

Office Action in Chinese Application No. 201510537061.6 dated Jun. 20, 2017, with English translation.
(Continued)

*Primary Examiner* — Calvin C Ma
(74) *Attorney, Agent, or Firm* — Womle Bond Dickinson (US) LLP

(57) ABSTRACT

The embodiments of the present invention provide an OLED array substrate, a method for manufacturing the OLED array substrate, and a touch display device. The OLED array substrate includes a first metal layer pattern, a transparent conductive layer pattern, an insulating layer pattern disposed between the first metal layer pattern and the transparent conductive layer pattern. The first metal layer pattern
(Continued)

includes a metal bridge line. The transparent conductive layer pattern includes an anode of an OLED, a plurality of first electrodes extending in a first direction and a plurality of second electrodes extending in a second direction. Each of the first electrodes includes a plurality of first sub-electrodes, and each of the first sub-electrodes is electrically connected to a corresponding metal bridge line.

20 Claims, 4 Drawing Sheets

(51) Int. Cl.
    *G09G 3/3225*     (2016.01)
    *H01L 27/32*     (2006.01)
    *H01L 51/52*     (2006.01)
    *H01L 51/56*     (2006.01)
    *G06F 3/044*     (2006.01)
    *H01L 27/12*     (2006.01)

(52) U.S. Cl.
    CPC ........... *G09G 3/3225* (2013.01); *H01L 21/77* (2013.01); *H01L 27/323* (2013.01); *H01L 27/3248* (2013.01); *H01L 27/3262* (2013.01); *H01L 51/5209* (2013.01); *H01L 51/56* (2013.01); *G06F 2203/04111* (2013.01); *H01L 27/124* (2013.01); *H01L 27/3276* (2013.01); *H01L 2227/323* (2013.01)

(58) Field of Classification Search
    USPC .................................................... 345/67, 690
    See application file for complete search history.

(56) References Cited

U.S. PATENT DOCUMENTS

| | | | |
|---|---|---|---|
| 2016/0172428 A1* | 6/2016 | Song | H01L 27/3276 257/99 |
| 2016/0181345 A1* | 6/2016 | Lee | H01L 27/3276 257/40 |
| 2016/0291790 A1 | 10/2016 | Yao | |
| 2017/0003800 A1 | 1/2017 | Zhu | |
| 2018/0173068 A1* | 6/2018 | Song | G02F 1/1368 |

FOREIGN PATENT DOCUMENTS

| | | |
|---|---|---|
| CN | 104750284 A | 7/2015 |
| CN | 105047609 A | 11/2015 |

OTHER PUBLICATIONS

"Second office action," CN Application No. 201510537061.6 (dated Apr. 4, 2018).
International Search Report and Written Opinion in PCT/CN2015/097110 dated May 27, 2016, with English translation.

* cited by examiner

OLED ARRAY SUBSTRATE, MANUFACTURING METHOD THEREOF AND TOUCH DISPLAY DEVICE

RELATED APPLICATIONS

The present application is the U.S. national phase entry of the international application PCT/CN2015/097110, with an international filing date of Dec. 11, 2015, which claims the benefit of Chinese Patent Application No. 201510537061.6, filed on Aug. 27, 2015, the entire disclosures of which are incorporated herein by reference.

TECHNICAL FIELD

The present invention relates to the field of display technology, in particular to an OLED array substrate, a method for manufacturing the OLED array substrate, and a touch display device.

BACKGROUND

Active matrix organic light emitting diode (AMOLED) has the advantages of quick response, high brightness, low power consumption, wide viewing angle and flexible display. It has become the mainstream of the display technology. The AMOLED display with touch function is generated based on the need for functional enrichment. Commonly used touch technology includes On-cell touch technology and In-cell touch technology. The On-cell touch technology is typically used in small and medium size AMOLED display. Compared with the On-cell touch technology, the In-cell touch technology can make the display thin and light, so the application of In-cell touch technology in AMOLED display is attracting great attention.

However, the existing In-cell touch technology is limited to the glass packaging process, and cannot be achieved in the film packaging process. The reason is that the film packaging process is a packaging process depositing multiple films on an array substrate in a vacuum environment, to prevent moisture and oxygen erosion of the OLED device. This package does not need to cover the array substrate with a glass substrate, i.e., there is no packaging substrate. Therefore, the sensor cannot be applied on a packaging substrate. Thus it can be seen that the existing In-cell touch technology has a great limitation in the application of AMOLED display.

SUMMARY

In view of the shortcomings of the prior art, the present invention proposes an OLED array substrate, a manufacturing method thereof and a touch display device which can solve the above technical problems to realize the application of In-cell touch technology in the AMOLED displays under different packaging processes.

According to a first aspect of the invention, an embodiment of the invention discloses an OLED array substrate including a first metal layer pattern, a transparent conductive layer pattern, and an insulating layer pattern disposed between the first metal layer pattern and the transparent conductive layer pattern. The first metal layer pattern includes a metal bridge line. The transparent conductive layer pattern includes an anode of an OLED, a plurality of first electrodes extending in a first direction and a plurality of second electrodes extending in a second direction. Each of the first electrodes includes a plurality of first sub-electrodes. Each of the first sub-electrodes is electrically connected to a corresponding metal bridge line.

Optionally, each of the second electrodes includes a plurality of second sub-electrodes. A connecting line connecting two adjacent second sub-electrodes is arranged between two first sub-electrodes adjacent to each other in the first direction.

Optionally, the OLED array substrate further includes at least one thin film transistor. The second sub-electrode is disposed between anodes of two OLEDs adjacent to each other in a first direction. The second sub-electrode is located over the thin film transistor. The first sub-electrode is disposed between anodes of two OLEDs adjacent to each other in the second direction.

Optionally, the OLED array substrate further includes a second metal layer pattern insulated and spaced from the first metal layer pattern. The second metal layer pattern includes a gate line, the first metal layer pattern includes a data line and the metal bridge line. The gate line and the data line intersect each other. The metal bridge line is parallel to the data line.

Optionally, the OLED array substrate further includes a power supply line arranged in the same layer as the data line and parallel to the data line.

Optionally, the OLED array substrate further includes at least one thin film transistor. The second metal layer pattern includes a gate of the thin film transistor, the first metal layer pattern includes a source and a drain of the thin film transistor.

Optionally, the OLED array substrate further includes two thin film transistors. A gate of a first thin film transistor is electrically connected to the gate line, a source of the first thin film transistor is electrically connected to a gate of a second thin film transistor. A drain of the first thin film transistor is electrically connected to the data line. A source of the second thin film transistor is electrically connected to the anode of the OLED. A drain of the second thin film transistor is electrically connected to the power supply line.

According to a second aspect of the invention, an embodiment of the invention discloses a method for manufacturing an OLED array substrate. The method includes: forming a first metal layer pattern including a metal bridge line on a basal substrate; forming an insulating layer pattern on the first metal layer pattern; and forming a transparent conductive layer pattern including an anode of an OLED, a plurality of first electrodes extending in a first direction and a plurality of second electrodes extending in a second direction on the insulating layer pattern. Each of the first electrodes includes a plurality of first sub-electrodes, each of the first sub-electrodes is electrically connected to a corresponding metal bridge line.

Optionally, the step of forming a transparent conductive layer pattern including an anode of an OLED, a plurality of first electrodes extending in a first direction and a plurality of second electrodes extending in a second direction on the insulating layer pattern includes: forming a plurality of second sub-electrodes extending in a second direction and forming a connecting line connecting two adjacent second sub-electrodes between two first sub-electrodes adjacent to each other in the first direction.

Optionally, the method further includes: forming a second metal layer pattern insulated and spaced from the first metal layer pattern. The second metal layer pattern includes a gate line. The first metal layer pattern includes a data line and the metal bridge line. The gate line and the data line intersect each other, and the metal bridge line is parallel to the data line.

Optionally, the method further includes: during forming the data line, forming a power supply line in the same layer as the data line and parallel to the data line.

Optionally, the second metal layer pattern includes a gate of a thin film transistor, the first metal layer pattern includes a source and a drain of the thin film transistor.

According to a third aspect of the invention, an embodiment of the invention discloses a touch display device including the above mentioned OLED array substrate.

According to a fourth aspect of the invention, an embodiment of the invention discloses a driving method for driving the above mentioned OLED array substrate. The driving method includes: driving the OLED array substrate for display and driving the array substrate for touch control. The step of driving the OLED array substrate for display includes: applying a gate scanning signal to the gate line and applying a data signal to the data line. The step of driving the array substrate for touch control includes: applying a touch scanning signal to the first electrodes and the second electrodes.

Optionally, driving the OLED array substrate for display and driving the array substrate for touch control are performed simultaneously.

Optionally, driving the OLED array substrate for display and driving the array substrate for touch control are performed alternately.

According to the above mentioned solutions, in the OLED array substrate, the method for manufacturing the OLED array substrate, and the touch display device disclosed by the embodiments of the invention, the first electrode and the second electrode are arranged in the same layer as the anode of the OLED, the plurality of first sub-electrodes are electrically connected through the metal bridge lines, forming the first electrode. Therefore, the anode, the first electrode and the second electrode formed in the same layer do not interfere with each other. A touch sensor function is then achieved with the touch sensing line constituted by the first electrodes and the touch driving line constituted by the second electrodes, which can be applied to AMOLED displays under different packaging processes.

BRIEF DESCRIPTION OF THE DRAWINGS

The features and advantages of the invention will be more clearly understood by reference to the accompanying drawings. The drawings are indicative and should not be construed as limitations on the invention. In the drawings.

Reference signs: 1—gate line, 2—data line, 3—power supply line, 4—metal bridge line, 5—anode, 6—second electrode, 7—first electrode, 8—first thin film transistor, 9—second thin film transistor, 10—via hole, 61—second sub-electrode, 62—connecting line, 71—first sub-electrode, 81—gate of the first thin film transistor, 82—source of the first thin film transistor, 83—drain of the first thin film transistor, 91—gate of the second thin film transistor, 92—source of the second thin film transistor, 93—drain of the second thin film transistor.

DETAILED DESCRIPTION OF THE INVENTION

Embodiments of the present invention will now be described in detail with reference to the accompanying drawings.

The present invention aims to provide an OLED (organic light emitting diode) array substrate, a method for manufacturing the same, and a touch display device for implementing In-cell touch technology in an AMOLED display. Moreover, the implementation of In-cell touch technology is not limited by the preparation process of the display panel in the AMOLED display.

Figure 1:
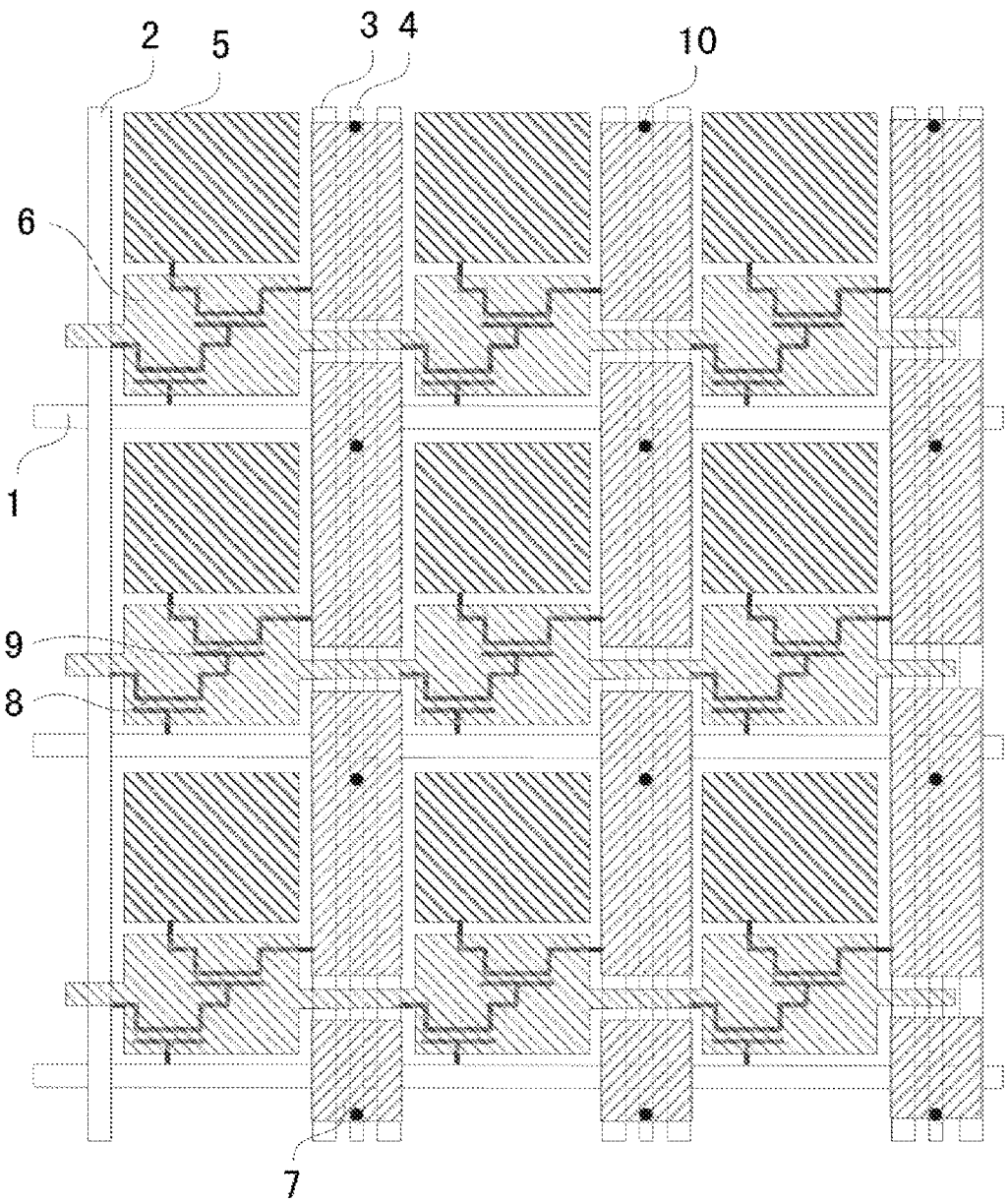
FIG. 1 is a structural schematic diagram of an OLED array substrate provided by an embodiment of the invention.
Figure 2:
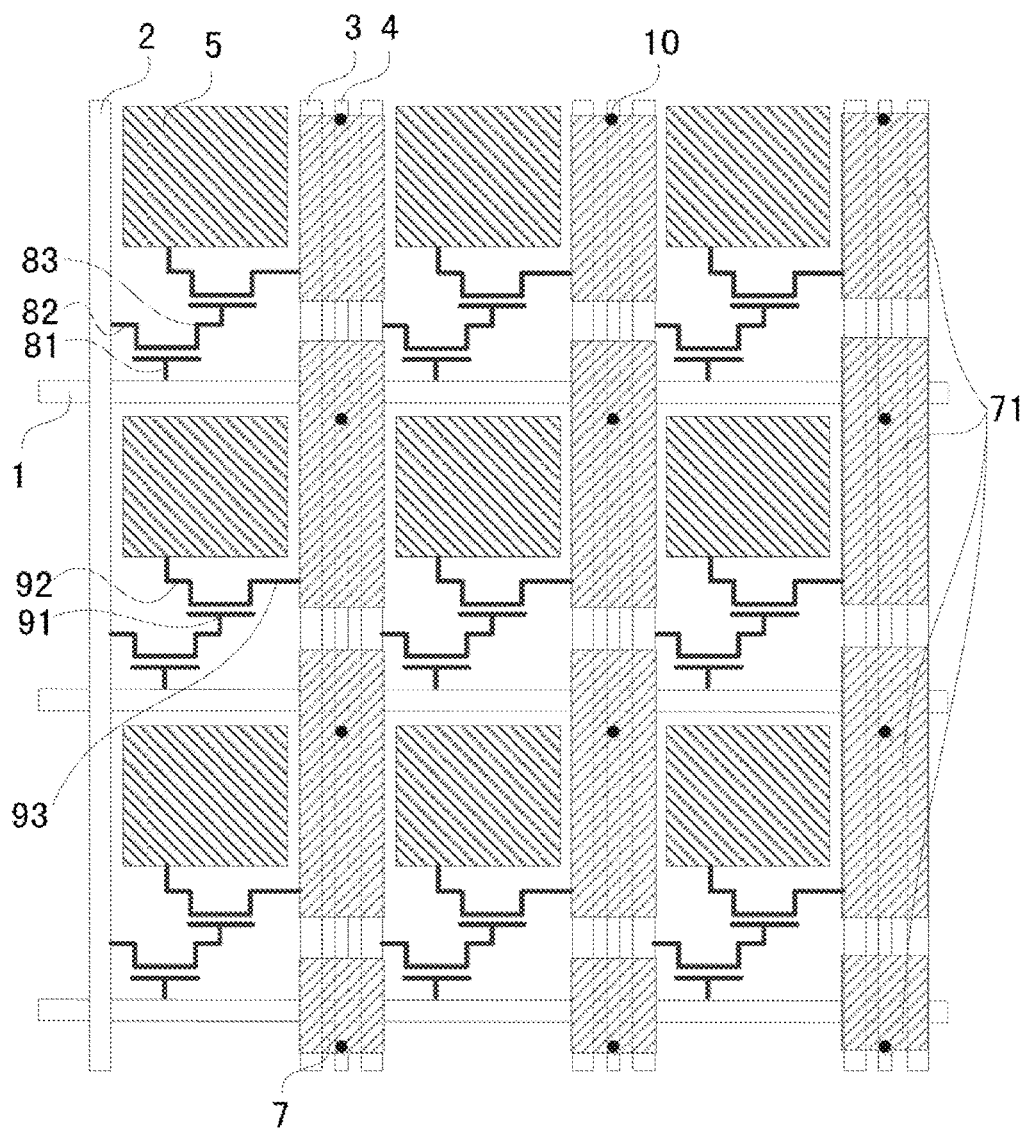
FIG. 2 is a top view of a touch sensing line provided by an embodiment of the invention.

FIG. 1 is a structural schematic diagram of an OLED array substrate provided by an embodiment of the invention. FIG. 2 is a top view of a touch sensing line provided by an embodiment of the invention. The OLED array substrate includes a first metal layer pattern, a transparent conductive layer pattern, and an insulating layer pattern (e.g., an insulating layer) disposed between the first metal layer pattern and the transparent conductive layer pattern. As shown in FIG. 1, the first metal layer pattern includes a metal bridge line 4. The transparent conductive layer pattern includes an anode 5 of an OLED, a plurality of first electrodes 7 extending in a first direction and a plurality of second electrodes 6 extending in a second direction. Each of the first electrodes 7 includes a plurality of first sub-electrodes 71, as show in FIG. 2. Each of the first sub-electrodes 71 is electrically connected to a corresponding metal bridge line 4.

It should be understood that the insulating layer pattern disposed between the first metal layer pattern and the transparent conductive layer pattern can include a via hole 10. Each of the first sub-electrodes 71 in the first electrode 7 can be electrically connected to the corresponding metal bridge line 4 through the via hole 10 in the insulating layer pattern.

In the OLED array substrate, the first electrode 7 and the second electrode 6 are arranged in the same layer as the anode 5 of the OLED, the plurality of first sub-electrodes 71 are electrically connected through the metal bridge lines 4, forming the first electrode 7. Therefore, the anode 5, the first electrode 7 and the second electrode 6 formed in the same layer do not interfere with each other. A touch sensor function with high signal-to-noise ratio is then achieved with the touch sensing line constituted by the first electrodes 7 and the touch driving line constituted by the second electrodes 6, which can be applied to AMOLED displays under different packaging processes.

In the context of the present disclosure, the first metal layer pattern and the transparent conductive layer pattern, which are insulated and spaced from each other, can be understood to be an insulating arrangement between the first metal layer pattern and the transparent conductive layer pattern. For example, an insulating layer may be provided, which is not limited herein.

In order to realize the touch function and avoid the mutual interference between the first electrode 7, the second electrode 6 and the anode 5, the plurality of the first sub-electrodes 71 are electrically connected through the metal bridge lines 4 to form the first electrode 7 extending in the first direction. As shown in FIG. 1 and FIG. 2, each of the first electrodes 7 constitutes a touch sensing line, which is used for transmitting a touch sensing signal. Each of the second electrodes 6 constitutes a touch driving line, which is used for transmitting a touch driving signal. In this way, the array substrate achieves the touch sensor function, which can be applied to AMOLED displays under different packaging processes. Optionally, the first electrodes 7 are uniformly arranged in the row direction, and the second electrodes 6 are uniformly arranged in the column direction.

Figure 3:
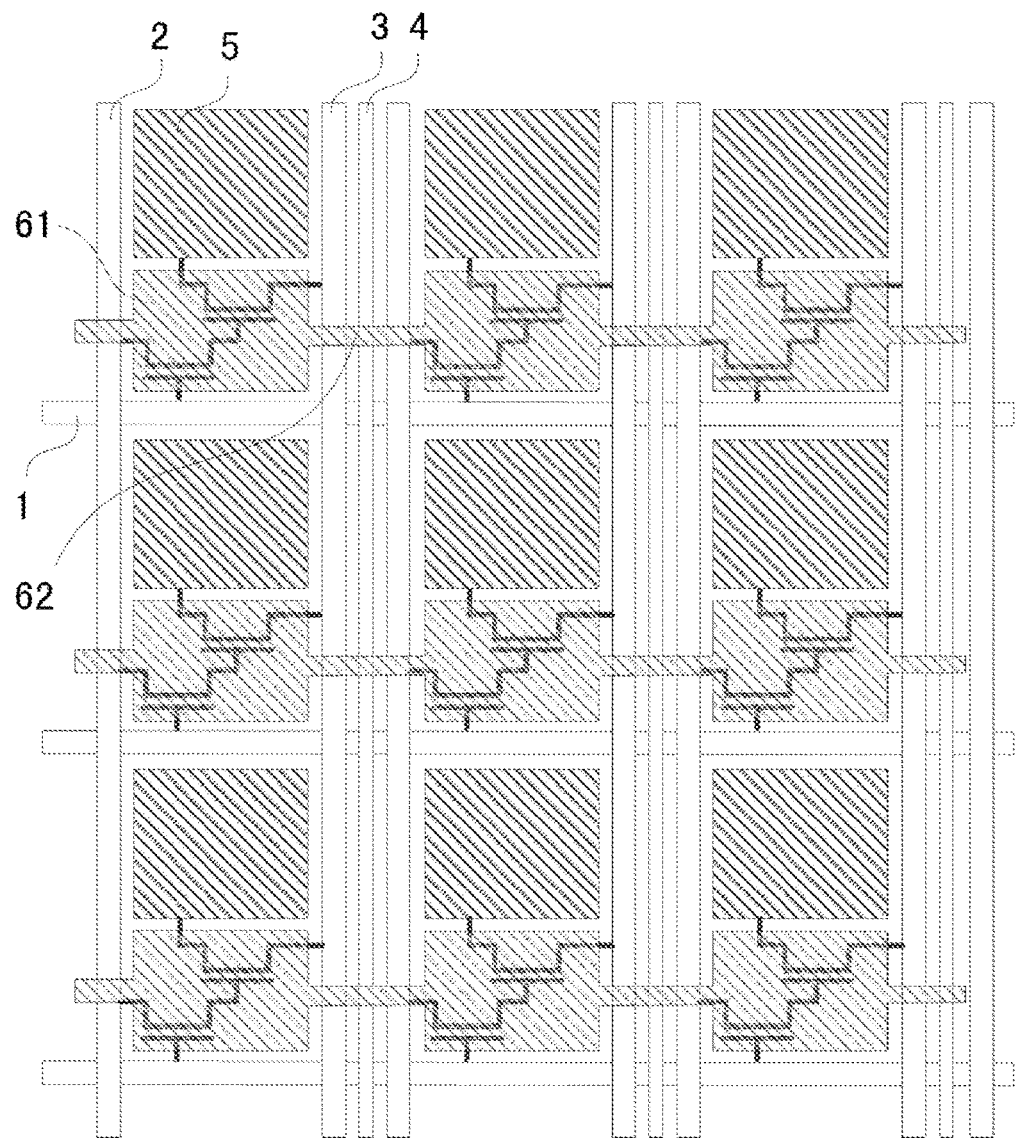
FIG. 3 is a top view of a touch driving line provided by an embodiment of the invention.

In an optional implementation of the present embodiment, as shown in FIG. 1 and FIG. 3, each of the second electrodes 6 includes a plurality of second sub-electrodes 61. A connecting line 62 connecting two adjacent second sub-electrodes 61 is arranged between two first sub-electrodes 71 adjacent to each other in the first direction (i.e., the column direction). The second sub-electrode 61 and the connecting line 61 can be integrally formed. It should be noted that two adjacent second sub-electrodes 61 can be understood as two second sub-electrodes 61 adjacent to each other in the second direction (i.e., the row direction).

The specific structure of the above mentioned array substrate will be described in detail below. The array substrate includes a basal substrate. A second metal layer pattern, a first metal layer pattern, and a transparent conductive layer pattern are formed on the basal substrate. The array substrate further includes a thin film transistor. The second metal layer pattern, the first metal layer pattern and the transparent conductive layer pattern are insulated from each other. The second metal layer pattern includes a gate line 1. The first metal layer pattern includes a data line 2, a power supply line 3 and a metal bridge line 4. The gate line 1 and the data line 2 intersect each other. The metal bridge line 4 and the power supply line 3 are parallel to the data line 2. As shown in FIG. 1, the gate lines 1 are uniformly arranged in the column direction, and the metal bridge lines 4 and the data lines 2 are uniformly arranged in the row direction.

It should be noted that the number of the thin film transistor in each pixel unit of the above mentioned array substrate may be one or more. For example, the pixel unit can be a 2T1C type pixel unit including two thin film transistors and one capacitor. A 6T2C type pixel unit can also be applied, which includes a structure of six thin film transistors and two capacitors. Moreover, the thin film transistor can be either the top gate type or the bottom gate type. Certainly, the above mentioned structures do not affect the setting of the touch driving line and the touch sensing line in the present embodiment. Therefore, the present embodiment is applicable to one or more of the above mentioned thin film transistors, and thin film transistors of either top gate type or bottom gate type.

For example, the array substrate includes two thin film transistors. The second metal layer pattern includes the gates of the thin film transistors, and the first metal layer pattern includes the sources and drains of the thin film transistors. A gate 81 of a first thin film transistor 8 is electrically connected to the gate line 1, a source 82 of the first thin film transistor 8 is electrically connected to a gate 91 of a second thin film transistor 9. A drain 83 of the first thin film transistor 8 is electrically connected to the data line 2. A source 92 of the second thin film transistor 9 is electrically connected to the anode 5 of the OLED. A drain 93 of the second thin film transistor 9 is electrically connected to the power supply line 3.

In an alternative embodiment, the first electrode 7 includes a plurality of first sub-electrodes 71 extending in a first direction, the second electrode 6 includes a plurality of second sub-electrodes 61 extending in a second direction. The first electrodes 7 are uniformly arranged in the row direction and the second electrodes 6 are uniformly arranged in the column direction. Each of the second sub-electrodes 61 in each second electrode 6 is electrically connected to a corresponding metal bridge line 4 through a via hole, then the metal bridge line 4 can be arranged in the same layer as the gate line 1 and parallel to the gate line 1. Accordingly, a connecting line connecting two adjacent first sub-electrodes 71 can be arranged between two adjacent second sub-electrodes 61 (not shown). The first sub-electrode 71 and the connecting line can be integrally formed. Each of the first electrodes 7 constitutes a touch sensing line for transmitting a touch sensing signal. Each of the second electrodes 6 constitutes a touch driving line for transmitting a touch driving signal. In this way, the array substrate achieves the touch sensor function, which can be applied to AMOLED displays under different packaging processes. For the structure of this embodiment (e.g., the second metal layer pattern and the first metal layer pattern), except that the position of the metal bridge line 4 is different from that in the previous embodiment, other layer patterns such as the thin film transistor, the power supply line 3 and the data line 2 are same to the configuration in the previous embodiment, which will not be described in detail in this embodiment.

In the above mentioned two embodiments, the first electrode 7, the second electrode 6 and the anode 5 of the OLED can be formed in the same layer. In order to prevent the anode 5, the first electrode 7 and the second electrode 6 from interfering with each other, the plurality of sub-electrodes can be electrically connected through the metal bridges 4 to form the first electrode 7, and the plurality of second sub-electrodes can be electrically connected through the metal bridges 4 to form the second electrode 6. Therefore, the touch sensing line constituted by the first electrode 7 and the touch driving line constituted by the second electrode 6 are formed in the same layer as the anode 5 of the OLED on the array substrate. In this way, the touch sensor function can be achieved and applied to AMOLED displays under different packaging processes.

It should be noted that in the above mentioned solutions, in order not to affect the aperture ratio, the second sub-electrode 61 can be provided between the anodes 5 of two OLEDs adjacent to each other in the first direction, the second sub-electrodes 61 can be located above the thin film transistors, and the first sub-electrode 71 can be provided between the anodes 5 of two OLEDs adjacent to each other in the second direction.

Figure 4:
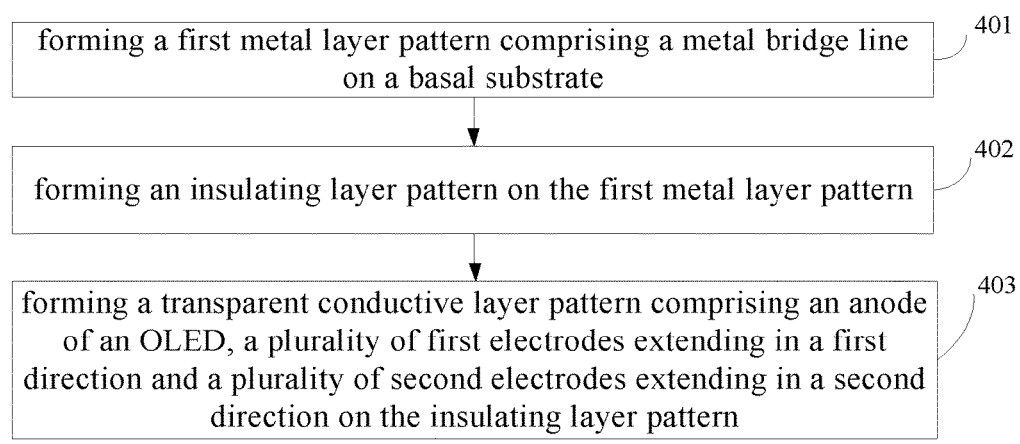
FIG. 4 is a flow chart of a method for manufacturing an OLED array substrate provided by an embodiment of the invention.

FIG. 4 is a flow chart of a method for manufacturing an OLED array substrate provided by an embodiment of the invention. As show in FIG. 4, the method includes the following steps. In step 401, a first metal layer pattern including a metal bridge line 4 is formed on a basal substrate. In step 402, an insulating layer pattern is formed on the first metal layer pattern. It can be understood that in step 402, the insulating layer pattern may include a via hole, so that each of the first sub-electrodes 71 can be electrically connected to a corresponding metal bridge line 4 through the via hole. In step 403, a transparent conductive layer pattern including an anode of an OLED, a plurality of first electrodes extending in a first direction and a plurality of second electrodes extending in a second direction are formed on the insulating layer pattern. Each of the first electrodes 7 includes a plurality of first sub-electrodes 71, each of the first sub-electrodes 71 is electrically connected to a corresponding metal bridge line 4 through a via hole.

It should be noted that one or more insulating layers can be disposed between the first metal layer pattern and the transparent conductive layer pattern, which is not limited herein.

In the above mentioned method, the first electrode 7 and the second electrode 6 are arranged in the same layer as the anode 5 of the OLED, the plurality of first sub-electrodes 71 are electrically connected through the metal bridge lines 4, forming the first electrode 7. Therefore, the anode 5, the first electrode 7 and the second electrode 6 formed in the same layer do not interfere with each other. A touch sensor function with high signal-to-noise ratio is then achieved with the touch sensing line constituted by the first electrodes 7 and the touch driving line constituted by the second electrodes 6, which can be applied to AMOLED displays under different packaging processes.

In particular, the step 401 includes: forming a first metal layer on a basal substrate by means of vacuum deposition or magnetron sputtering, and forming a first metal layer pattern with a one-time composition process (e.g., an etching process). The first metal layer pattern includes a metal bridge line 4. The basal substrate can be a glass substrate, a quartz substrate, or an organic resin substrate.

It can be understood that in the above mentioned method, before the formation of the first metal layer pattern on the basal substrate, the steps of forming the thin film transistor and the second metal layer pattern can also be included. The preparation of the above mentioned array substrate can be illustrated in detail with a specific embodiment.

In step 501, a second metal layer is formed on a basal substrate, and a second metal layer pattern is formed with a one-time composition process.

In step 502, a first metal layer is formed on the second metal layer pattern. The first metal layer and the second metal layer pattern are insulated from each other. For example, an insulating layer is provided.

In step 503, a first metal layer pattern is formed by a one-time composition process.

In step 504, a transparent conductive layer is formed on the first metal layer pattern, the first metal layer pattern and the transparent conductive layer are insulated from each other. For example, an insulating layer is provided.

In step 505, the transparent conductive layer pattern described in the above mentioned embodiment is formed by a one-time composition process.

In steps 501-503, a step of forming the thin film transistor(s) can also be included. Specifically, the insulating layer between the first metal layer pattern and the second metal layer pattern, and the insulating layer between the first metal layer pattern and the transparent conductive layer pattern can be formed with a plurality of via holes. The second metal layer pattern includes the gate of the thin film transistor and the gate line. The first metal layer pattern includes the source and the drain of the thin film transistor, the data line 2, the power supply line 3, and the metal bridge line 4. The data line 2, the power supply line 3 and the metal bridge line 4 are parallel to each other. The transparent conductive layer pattern includes the anode 5 of the OLED, the first sub-electrodes 71, the second sub-electrodes 61, and the connecting line 62. The plurality of first sub-electrodes 71 are arranged in a first direction (column direction) and electrically connected to the metal bridge lines 4 through via holes. The plurality of second sub-electrodes 61 extending in the second direction (row direction) are formed, and the connection line 62 connecting the adjacent second sub-electrodes 61 is formed between two first sub-electrodes 71 adjacent to each other in the first direction.

The above mentioned patterns can also include the following structures. The second metal layer pattern includes the gate of the thin film transistor, the first metal layer pattern includes the source and the drain of the thin film transistor. The second metal layer pattern includes the gate line 1. The first metal layer pattern includes the data line 2 and the metal bridge line 4, which are parallel to each other. The gate line 1 and the data line 2 intersect each other. For example, the gate line 1 is arranged in the row direction, and the data line 2 is arranged in the column direction. The positions of the gate, the source and the drain of the thin film transistor are not limited herein.

In an alternatively embodiment, in the transparent conductive layer pattern, the adjacent first sub-electrodes 61 can be connected with each other through connecting lines (not shown) provided between adjacent second sub-electrodes 71. Accordingly, each of the second sub-electrodes 71 is electrically connected to the metal bridge line 4 through the via hole. In this case, the second metal layer pattern includes the metal bridge line 4, the metal bridge line 4 can be parallel to the gate line 1. The above structure is not limited by the present embodiment. The purpose is to form the first electrode 7 and the second electrode 6 in the same layer as the anode 5, without interference between the electrodes.

It should be noted that an insulating layer can be formed over the anode 5. A via hole can be formed in the insulating layer, through which the anode 5 is connected to the organic light emitting layer and the cathode.

In this embodiment, the first metal layer, the second metal layer, and the transparent conductive layer can be formed by vacuum deposition or magnetron sputtering. These layers are insulated from each other. One or more insulating layers, or other layers can be applied. The first metal layer pattern, the second metal layer pattern, and the transparent conductive layer pattern can be formed by a composition process such as etching, which will not be described in detail herein.

An embodiment of the invention also provides a touch display device including the above mentioned OLED array substrate.

The touch display device in the embodiment of the present invention can be any product or component with display function, such as mobile phone, tablet computer, TV, notebook computer, digital photo frame, navigator and so on.

An embodiment of the invention provides a driving method for driving the above mentioned OLED array substrate. The driving method includes: driving the OLED array substrate for display and driving the array substrate for touch control. The step of driving the OLED array substrate for display includes: applying a gate scanning signal to the gate line and applying a data signal to the data line, without any signal input to the first electrode and the second electrode. The step of driving the array substrate for touch control includes: applying a touch scanning signal to the first electrodes and the second electrodes, without any signal input to the gate line and the data line.

In an optional implementation of the embodiment, the step of driving the OLED array substrate for display and the step of driving the array substrate for touch control are performed simultaneously.

In an optional implementation of the embodiment, the step of driving the OLED array substrate for display and the step of driving the array substrate for touch control are performed alternately.

In the above mentioned embodiments, since the display area and the touch area are separate, a higher signal-to-noise ratio can be achieved.

Though the embodiments of the present invention have been described in conjunction with the accompanying drawings, various modifications and variations can be made by those skilled in the art without departing from the spirit and scope of the invention, and such modifications and variations are within the scope defined by the appended claims.

What is claimed is:

1. An OLED array substrate, comprising: a first metal layer pattern, a transparent conductive layer pattern, an insulating layer pattern disposed between the first metal layer pattern and the transparent conductive layer pattern; the first metal layer pattern comprising a metal bridge line; the transparent conductive layer pattern comprising an anode of an OLED, a plurality of first electrodes extending in a first direction and a plurality of second electrodes extending in a second direction; each of the first electrodes comprising a plurality of first sub-electrodes; each of the first sub-electrodes being electrically connected to a corresponding metal bridge line;
wherein each first electrode constitutes a touch sensing line, and each second electrode constitutes a touch driving line.

2. The OLED array substrate according to claim 1, wherein each of the second electrodes comprises a plurality of second sub-electrodes, a connecting line connecting two adjacent second sub-electrodes is arranged between two first sub-electrodes adjacent to each other in the first direction.

3. The OLED array substrate according to claim 2, further comprising at least one thin film transistor; wherein the second sub-electrode is disposed between anodes of two OLEDs adjacent to each other in a first direction, the second sub-electrode is located over the thin film transistor; the first sub-electrode is disposed between anodes of two OLEDs adjacent to each other in the second direction.

4. The OLED array substrate according to claim 1, further comprising a second metal layer pattern insulated and spaced from the first metal layer pattern; wherein the second metal layer pattern comprises a gate line, the first metal layer pattern comprises a data line and the metal bridge line; the gate line and the data line intersect each other, the metal bridge line is parallel to the data line.

5. The OLED array substrate according to claim 4, further comprising a power supply line arranged in the same layer as the data line and parallel to the data line.

6. The OLED array substrate according to claim 5, further comprising at least one thin film transistor; wherein the second metal layer pattern comprises a gate of the thin film transistor, the first metal layer pattern comprises a source and a drain of the thin film transistor.

7. The OLED array substrate according to claim 6, further comprising two thin film transistors; wherein a gate of a first thin film transistor is electrically connected to the gate line, a source of the first thin film transistor is electrically connected to a gate of a second thin film transistor, a drain of the first thin film transistor is electrically connected to the data line; and wherein a source of the second thin film transistor is electrically connected to the anode of the OLED, a drain of the second thin film transistor is electrically connected to the power supply line.

8. A driving method for driving the OLED array substrate according to claim 4, comprising:
driving the OLED array substrate for display and driving the array substrate for touch control;
wherein driving the OLED array substrate for display comprises: applying a gate scanning signal to the gate line and applying a data signal to the data line; and wherein driving the array substrate for touch control comprises: applying a touch scanning signal to the first electrodes and the second electrodes.

9. The method according to claim 8, wherein driving the OLED array substrate for display and driving the array substrate for touch control are performed simultaneously.

10. The method according to claim 8, wherein driving the OLED array substrate for display and driving the array substrate for touch control are performed alternately.

11. A touch display device, comprising the OLED array substrate according to claim 1.

12. The touch display device according to claim 11, wherein each of the second electrodes comprises a plurality of second sub-electrodes, a connecting line connecting two adjacent second sub-electrodes is arranged between two first sub-electrodes adjacent to each other in the first direction.

13. The touch display device according to claim 12, wherein the OLED array substrate further comprises at least one thin film transistor; wherein the second sub-electrode is disposed between anodes of two OLEDs adjacent to each other in a first direction, the second sub-electrode is located over the thin film transistor; the first sub-electrode is disposed between anodes of two OLEDs adjacent to each other in the second direction.

14. The touch display device according to claim 11, wherein the OLED array substrate further comprises a second metal layer pattern insulated and spaced from the first metal layer pattern; wherein the second metal layer pattern comprises a gate line, the first metal layer pattern comprises a data line and the metal bridge line; the gate line and the data line intersect each other, the metal bridge line is parallel to the data line.

15. The touch display device according to claim 14, wherein the OLED array substrate further comprises a power supply line arranged in the same layer as the data line and parallel to the data line.

16. A method for manufacturing an OLED array substrate, comprising:
forming a first metal layer pattern comprising a metal bridge line on a basal substrate;
forming an insulating layer pattern on the first metal layer pattern; and
forming a transparent conductive layer pattern comprising an anode of an OLED, a plurality of first electrodes extending in a first direction and a plurality of second electrodes extending in a second direction on the insulating layer pattern;
wherein each of the first electrodes comprises a plurality of first sub-electrodes, each of the first sub-electrodes is electrically connected to a corresponding metal bridge line; each first electrode constitutes a touch sensing line, and each second electrode constitutes a touch driving line.

17. The method according to claim 16, wherein the step of forming a transparent conductive layer pattern comprising an anode of an OLED, a plurality of first electrodes extending in a first direction and a plurality of second electrodes extending in a second direction on the insulating layer pattern comprises:
forming a plurality of second sub-electrodes extending in a second direction and forming a connecting line connecting two adjacent second sub-electrodes between two first sub-electrodes adjacent to each other in the first direction.

18. The method according to claim 16, further comprising:

forming a second metal layer pattern insulated and spaced from the first metal layer pattern;

wherein the second metal layer pattern comprises a gate line, the first metal layer pattern comprises a data line and the metal bridge line; the gate line and the data line intersect each other, the metal bridge line is parallel to the data line.

19. The method according to claim 16, further comprising:

during forming the data line, forming a power supply line in the same layer as the data line and parallel to the data line.

20. The method according to claim 16, wherein the second metal layer pattern comprises a gate of a thin film transistor, the first metal layer pattern comprises a source and a drain of the thin film transistor.

* * * * *